(12) United States Patent
Kataoka et al.

(10) Patent No.: US 8,612,183 B2
(45) Date of Patent: Dec. 17, 2013

(54) ANALYSIS MODEL GENERATION SYSTEM

(75) Inventors: Ichiro Kataoka, Kudamatsu (JP); Ichiro Nishigaki, Ishioka (JP); Yoshimitsu Hiro, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 927 days.

(21) Appl. No.: 12/260,375

(22) Filed: Oct. 29, 2008

(65) Prior Publication Data

US 2009/0112529 A1 Apr. 30, 2009

(30) Foreign Application Priority Data

Oct. 31, 2007 (JP) .................................. 2007-283649

(51) Int. Cl.
*G06F 17/50* (2006.01)
*G06F 7/60* (2006.01)
*G06T 17/10* (2006.01)

(52) U.S. Cl.
USPC .................................. 703/1; 703/2; 345/420

(58) Field of Classification Search
USPC .............................................. 703/2; 345/420
See application file for complete search history.

(56) References Cited

U.S. PATENT DOCUMENTS

| 7,149,677 | B2 * | 12/2006 | Jayaram et al. ................. 703/22 |
| 7,304,642 | B2 | 12/2007 | Kataoka et al. |
| 2008/0106547 | A1 | 5/2008 | Kataoka et al. |

FOREIGN PATENT DOCUMENTS

| JP | 2005-301349 | 10/2005 |
| JP | 2006-318232 | 11/2006 |
| JP | 2008-107960 | 5/2008 |

OTHER PUBLICATIONS

Petersson et al. "Detecting Translation Errors in CAD Surfaces and Preparing Geometries for Mesh Generation", Aug. 27, 2001, 10th International Meshing Roundtable, 12 pages.*
Veleba et al. "Survey of Errors in Surface Prepresentation and their Detection and Correction", Jan. 10, 2007, 8 pages.*
Luebke et al. "Level of Detail for 3D graphics" 2003, 418 pages.*

\* cited by examiner

*Primary Examiner* — Suzanne Lo
(74) *Attorney, Agent, or Firm* — Antonelli, Terry, Stout & Kraus, LLP.

(57) ABSTRACT

An analysis model generation system, for generating an analysis model of an analysis target, by correcting a distortion configuration owned by a configuration mesh data, which is generated by changing configuration of the analysis target, being made up with hexahedrons, into meshes, comprises a mesh data read-in portion 110 for reading the configuration mesh data therein, a mesh quality estimate portion 111 for estimating quality of a mesh of the configuration mesh data, a first database 101 for classifying distortion configuration of the mesh into a pattern, so as to register it therein as a distorted mesh pattern, in advance, a mesh pattern determination portion 112 for determining, on which one of the distorted mesh patterns a distortion corresponds, when the mesh has the distortion as a result of the quality estimation within the mesh quality estimation portion, a second database 115 for registering therein correction methods for correcting the distortion, corresponding to the distorted mesh pattern registered in the first database, a mesh correcting portion 113 for correcting the distortion of the mesh upon basis of the correction method, and a mesh data display portion 114 for displaying a result of conducting the correction.

10 Claims, 11 Drawing Sheets

(i)

(ii)

(iii)

ANALYSIS MODEL GENERATION SYSTEM

BACKGROUND OF THE INVENTION

The present invention relates to an analysis model generation system for contributing a quality improvement of mesh data of an object of analysis, which is made from hexahedrons, and in more particular, it relates to an analysis model generation system for conducting a correction process by patterning distortion of the mesh.

In recent years, advancement was made in an automatic generating technology of mesh data. A technology for automatically generating the mesh data for use of analysis to be analyzed by an aid of CAE (Computer Aided Engineering) from the configuration data, which is produced with an aid of 3-dimensional CAD (Computer Aided Design), etc., since it results in reduction of time necessary for analyzing, is important for a design of analysis initiative type, i.e., executing an analysis simulation in an early stage with using the mesh data.

However, although the automatic generating technology of the mesh data was advanced, but in case where distortion is generated in the producing process, there is a problem, in particular, in development of the technology for correcting the distortion. As a technology for correcting the distortion is already proposed the Laplacian method, etc., and there is already commercialized an automatic producing tool, which applies that therein.

In the following Patent Document 1, in case where there is a distorted mesh, uniformity is obtained of the mesh quality by conducting the correction on plural numbers of meshes at the same time, with high accuracy, i.e., correcting, not only the distorted mesh, but also upon the peripheral elements thereof. In more details, upon a triangle mesh, distortion (i.e., skewness) is estimated, so as to conduct quality grouping process of meshes, and this triangle meshes grouped are presented by local coordinate systems, respectively, wherein a node coordinates of the triangle mesh and element information owned by the nodes are inputted into a neural network, so that the triangle meshes are divided into groups from this neural network. And, when correcting the triangle meshes, the correction same to that of the triangle meshes corrected are conducted upon the triangle meshes belonging to the same group, interlocking therewith. Thus, the meshes distorted and in the periphery thereof are divided into the groups, and are corrected, collectively, thereby achieving the uniformity of the meshes.

[Patent Document 1] Japanese Patent Laying-Open No. 2006-318232 (2006).

BRIEF SUMMARY OF THE INVENTION

By the way, there are cases where the correction cannot be made depending on the distortion of the mesh, it is necessary to change the correction method, flexibly, corresponding to the analyzing object, the analyzing model configuration or the distortion configuration of the mesh. The correction method for mesh described in the Patent Document 1, targeting a node movement, does not make the correction depending upon configuration depending upon various kinds of distorted configuration of meshes distorted, therefore it has a limit of the quality as the mesh data for use of analysis.

According to the present invention, by taking the drawbacks mentioned above into the consideration thereof, an object thereof is to provide an analysis model generation system for generating high quality mesh data for use of analysis, with conducing the correction process depending upon the distortion configuration of mesh.

For accomplishing the object mentioned above, according to the present invention, there is provided an analysis model generation system, for generating an analysis model of an analysis target, by correcting a distortion configuration owned by a configuration mesh data, which is generated by changing configuration of said analysis target, being made up with hexahedrons, into meshes, comprising: a mesh data read-in portion, which is configured to read said configuration mesh data therein; a mesh quality estimate portion, which is configured to estimate quality of a mesh of said configuration mesh data; a first database, which is configured to classify distortion configuration of said mesh into a pattern, so as to register it therein as a distorted mesh pattern, in advance; a mesh pattern determination portion, which is configured to determine, on which one of the distorted mesh patterns a distortion corresponds, when said mesh has said distortion as a result of the quality estimation within said mesh quality estimation portion; a second database, which is configured to register therein correction methods for correcting said distortion, corresponding to the distorted mesh pattern registered in said first database; a mesh correction portion, which is configured to correct said distortion of the mesh upon basis of said correction method; and a mesh data display portion, which is configured to display a result of conducting the correction.

Further, according to the present invention, within the analysis model generation system, as described in the above, wherein estimation is made on whether a mesh neighboring with the mesh as a correction target has the distortion or not, and if said neighboring mesh has the distortion, then said neighboring mesh is corrected together with said mesh as the correction target.

Further, according to the present invention, within the analysis model generation system, as described in the above, the correction method is proposed, corresponding to the mesh as the target of correction, in a diagonal manner.

And, further, according to the present invention, within the analysis model generation system, as described in the above, said distortion patters includes: a boomerang element, in which one (1) node of an element building up said mesh is not located at a proper position thereof, and thereby forming a boomerang-type configuration; a first negative element, in which one (1) node enters into an inside of said element, and therefore sides of the element intersect with each other, in a view direction thereof; a second negative element, a node of which is disposed on an element surface, therefore not intersecting, but is crushed on said element surface; a third negative element, in which the one (1) node of said element is outside said element, and therefore being shifted in the configuration of said element; and a distortion element, in which said element is extended, so that the element surface does not become a square but shows a warped shape, such as, a parallelogram or a rhomboid.

Thus, according to the present invention mentioned above, it is possible to provide the analysis model generation system, for generating the mesh data for use of analysis, with high quality, while classifying the distortion configuration of the mesh into a pattern, and conducing the correction method corresponding to that pattern.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE PREFERRED EMBODIMENTS

Hereinafter, embodiments according to the present invention will be fully explained by referring to the attached drawings.

Figure 1:
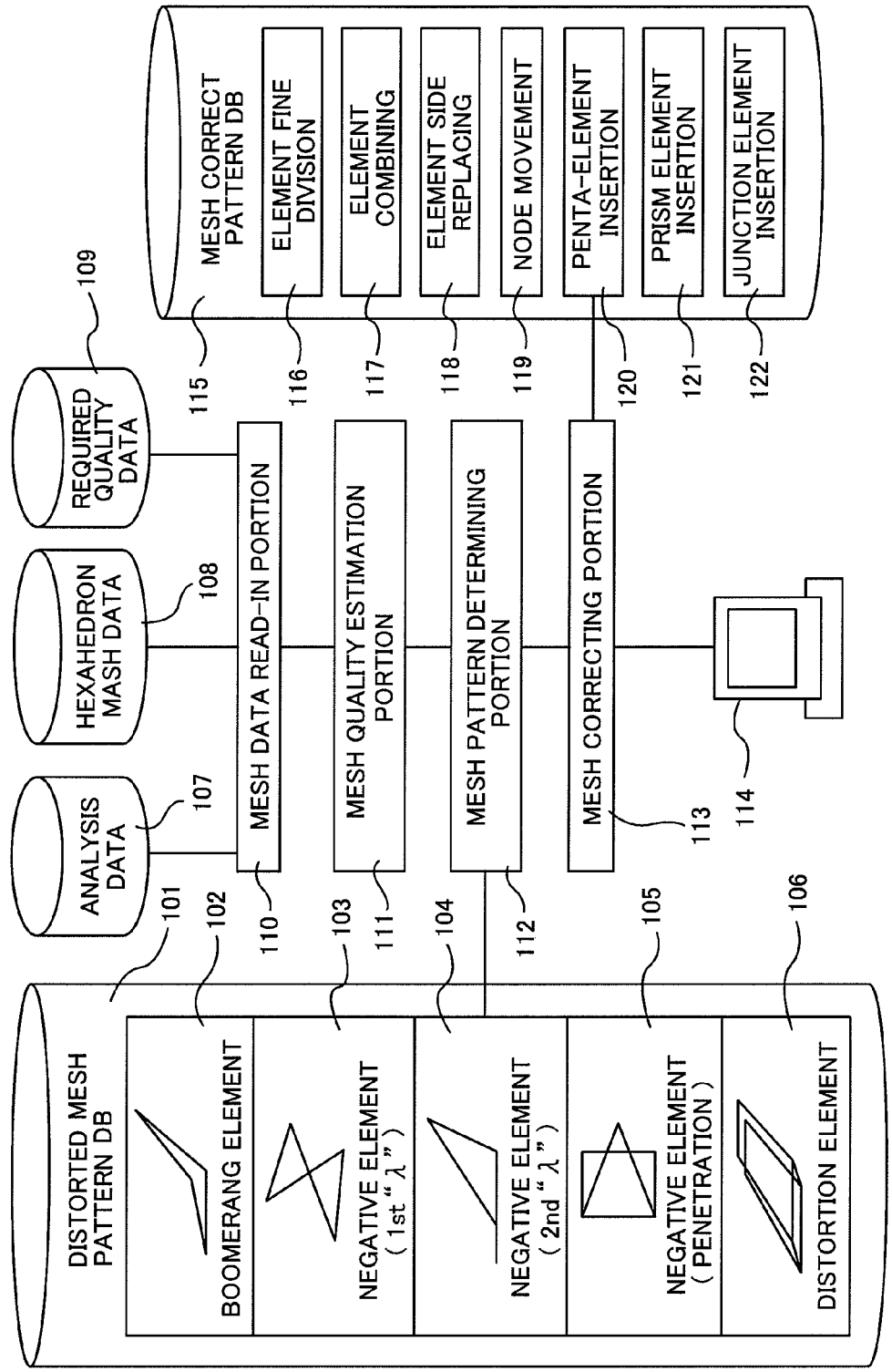
FIG. 1 is a view for showing the system structures of an analysis model generation system, according to an embodiment of the present invention.

FIG. 1 attached herewith is a view for showing the system structures of an analysis model generation system, according to an embodiment of the present invention. The analysis model generation system 1 comprises a distorted mesh pattern database 101 for classifying the distorted meshes and registering them as distorted mesh patterns therein, an analysis data storage portion 107 for storing analysis data for interlocking the distorted mesh pattern with a correction method corresponding thereto, a hexahedral mesh data storage portion 108 for storing hexahedral mesh data therein, a required quality data storage portion 109 for storing quality data required for the mesh, a mesh data read-in portion 110 for reading the data from each data storage portion, a mesh quality estimation portion 111 for estimating the quality of the mesh in the hexahedral mesh data read therein, a mesh pattern determining portion 112 for determining a distorted mesh pattern of the mesh to be corrected, a mesh correcting portion 113 for searching a correction method corresponding to the distorted mesh pattern, a mesh data display portion 114 for displaying the mesh data before and after the correction, and a mesh correction pattern database 115 for storing various kinds of correction methods corresponding to the various kinds of distorted mesh patterns mentioned above, as the data thereof.

Within the distorted mesh pattern database 101 are registered therein characteristic data for each of distortions, which are classified through patterning the distorted meshes. Further, for recognizing the distorted mesh as the pattern mentioned above, there are registered nodes of building up an element of the hexahedral mesh, nodes of an element surface facing to a certain element surface, together with data of the element surface and the periphery thereof, and also a threshold value of an angle defined between the nodes (i.e., an element interior angle), as the data thereof. Further, data of the element interior angles and data of element surfaces including each node, and also a threshold value, such as, "the element interior angle is equal or greater than 180 degree", etc., are registered therein as the data thereof, for the purpose of pattern recognition.

In more details, for example, when determining into which pattern the distorted mesh should be classified, then the above-mentioned threshold value of the element interior angle is used, which is registered within the mesh pattern database 101. Further, for example, while registering information, such as, "targeting the threshold value of the element interior angle or the element surface facing to the element surface for determination", etc., as the data into the distorted mesh pattern database 101, the data registered within the distorted mesh pattern database 101 is used as a condition, when determining the pattern, thereby the determination is made into which pattern it should be classified.

As the distorted pattern of the hexahedral meshes are the followings: i.e., a boomerang element 102 in the boomerang-like shape, since one (1) node of the element is not disposed at a proper or appropriate position thereof, and there are following elements; a first negative element ($1^{st}$ type of "λ" shape) 103, since one (1) node enters into an inside of the element, therefore the sides of the element intersect each other depending on an angle of seeing; a second negative element ($2^{nd}$ type of "λ" shape) 104, since the node is disposed on the element surface, therefore the sides do not intersect, but the element surface is crushed; a third negative element (penetration) 105, in which the shape of the element is shifted or slid, and further a distortion element, in which the element is extended, so that the element surface does not become a square but shows a warped shape, such as, a parallelogram or a rhomboid, for example.

Such the distorted mesh as was mentioned above can be obtained, when estimating the quality of the mesh, with using each of the following indexes, such as, distortion for estimating the distortion of the element, an interior angle at the element node, a surface warp angle indicative of warp or curvature of the element, and stretch indicative of expansion of the element, etc.

For example, the distortion is a value obtained through dividing Jacobian of the element by a volume, and it is within a region from 0 to 1.0 (when it is 1.0, in the condition of no distortion therein), but if there is any element, the volume of which cannot be calculated, it is a kind of the negative element mentioned above, there is a necessity of conducting the correction thereon, as the distortion element.

For classifying patterns of the distorted elements, in particular, for the boomerang-type element, the "λ"-shape type elements, and the penetration type element, the classification can be made by the following equations. When satisfying 1 in each equation, it means that it corresponds to that type of the element, respectively.

$$\text{Elem}(\text{FaceA},\text{FaceB})\Lambda\text{Face}(\text{NodeI},\text{Angle}(180))_A$$

$$\Lambda\text{Face}(\text{NodeI},\text{Angle}(180))_B \qquad \text{(Eq. 1)}$$

In case of the boomerang type element, when both of the element interior angles of two (2) element surfaces facing to each other are equal to or greater than 180 degree, then it is recognized to be the boomerang type element.

$$Elem(FaceA, FaceB) \wedge Face(NodeI, Angle(180))_A$$

$$\wedge Face(NodeJ, Angle(180))_A \wedge Face(NodeI, Angle(180))_B$$

$$\wedge Face(NodeJ, Angle(180))_B \quad \text{(Eq. 2)}$$

In case of the "λ"-shape type elements, when the interior angle of two (2) codes, each on the element surface, is equal to or greater than 180 degree, with respect to two (2) element surfaces, facing to each other, it is recognized to be the "λ"-shape type.

$$Face(NodeI, Angle(180)) \quad \text{(Eq. 3)}$$

In case of the penetration type element, when the interior angle is equal to or greater than 180 degree, at least at two (2) nodes, with respect to a certain element surface, it is recognized to be the penetration type.

$$Elem(FaceA, FaceB) \begin{cases} 1 \\ 0 \end{cases} \quad \text{(Eq. 4)}$$

"1": When an element surface "A" and an element surface "B" are facing to each other; and
"0": Other than the above.

$$Elem(NodeI, Angle(180)) = \begin{cases} 1 \\ 0 \end{cases} \quad \text{(Eq. 4)}$$

"1": When the interior angle of the node "I" on an element surface is equal to or greater than 180 degree; and
"0": Other than the above.

However, "Λ" means "and", in the above equations. Thus, in case of "AΛB", when satisfying both the condition "A" and the condition "B", then it becomes "1". Face(NodeI,Angle(180))$_A$ becomes "1", when the interior angle of the node "I" is equal to or greater than 180 degree, in relation to the element surface "A". Face (NodeI,Angle(180))$_B$ becomes "1", when the interior angle of the node "I" is equal to or greater than 180 degree, in relation to the element surface "B".

Other than the distorted mesh pattern database 101, there are the hexahedral mesh data storage portion 108, the required quality data storage portion 109 and the mesh correction pattern database 115.

The hexahedral mesh data storage portion 108 stores therein, so called, the configuration mesh data, i.e., hexahedral mesh data to be corrected, including the distortion of the mesh therein. Also, the required quality data storage portion 109 stores therein the data relating to the required quality, such as, the size of the element and the interior angle of the element, for estimating on whether the distorted mesh is or not, within the hexahedral mesh data mentioned above, and further, they are also used for renewing that data of the distorted mesh pattern database 101.

The mesh correction pattern database 115 stores therein the following methods: such as, element (mesh) fine divining 116, element side replacement 118, node movement 119, penta-element insertion 120, prism element insertion 121 and junction element insertion 122, for example, as a method for correcting the distorted element. Those methods are corresponding to the distortion patterns, which are registered within the distorted mesh pattern database 101. For example, when the distortion pattern corresponds to the boomerang element, the element (mesh) fine divining 116, the node movement 119, the prism element insertion 121 and the junction element insertion 122 are associated with or referred to it, as the corresponding correction methods. Other than this, if there is a method for correcting the mesh distortion, it is also possible to register it into this mesh correction pattern database.

Next, explanation will be made on an outline of the operations of the analysis model generation system shown in FIG. 1. First of all, the hexahedral mesh data mentioned above is read into the mesh data read-in portion 110. For the hexahedral mesh data read therein, estimation is made on the quality of the mesh, within the mesh quality estimation portion 111, upon basis of the required quality data mentioned above. Items to be estimated are the distortion mentioned above, the element volume, the element interior angle and the warp angle. In case when there is an element exceeding the threshold value, among those items, it is determined to be the distorted element, and then it is determined to which pattern it corresponds, within the distorted mesh pattern database 101, within the mesh pattern determining portion 112.

After completing the determination to which pattern the distorted mesh corresponds, determination is made on whether the element neighboring with the distorted element is also distorted or not, in the similar manner thereto, and also on whether grouping can be made on it or not. In case when it is possible to make the group thereof, a result of determination is displayed on the mesh data display portion 114, as the distorted mesh data.

For the distorted mesh data, a user can designate on which element the correction should be made, in a manner of dialogue. Within the mesh correcting portion 113, for the correction target point or spot designated, the correction method(s) are searched out from the mesh correction pattern database 115, corresponding to that distortion pattern upon basis of the analysis data mentioned above, and results of the mesh before and after the correction thereof are proposed to the user as a preview screen.

Figure 2:
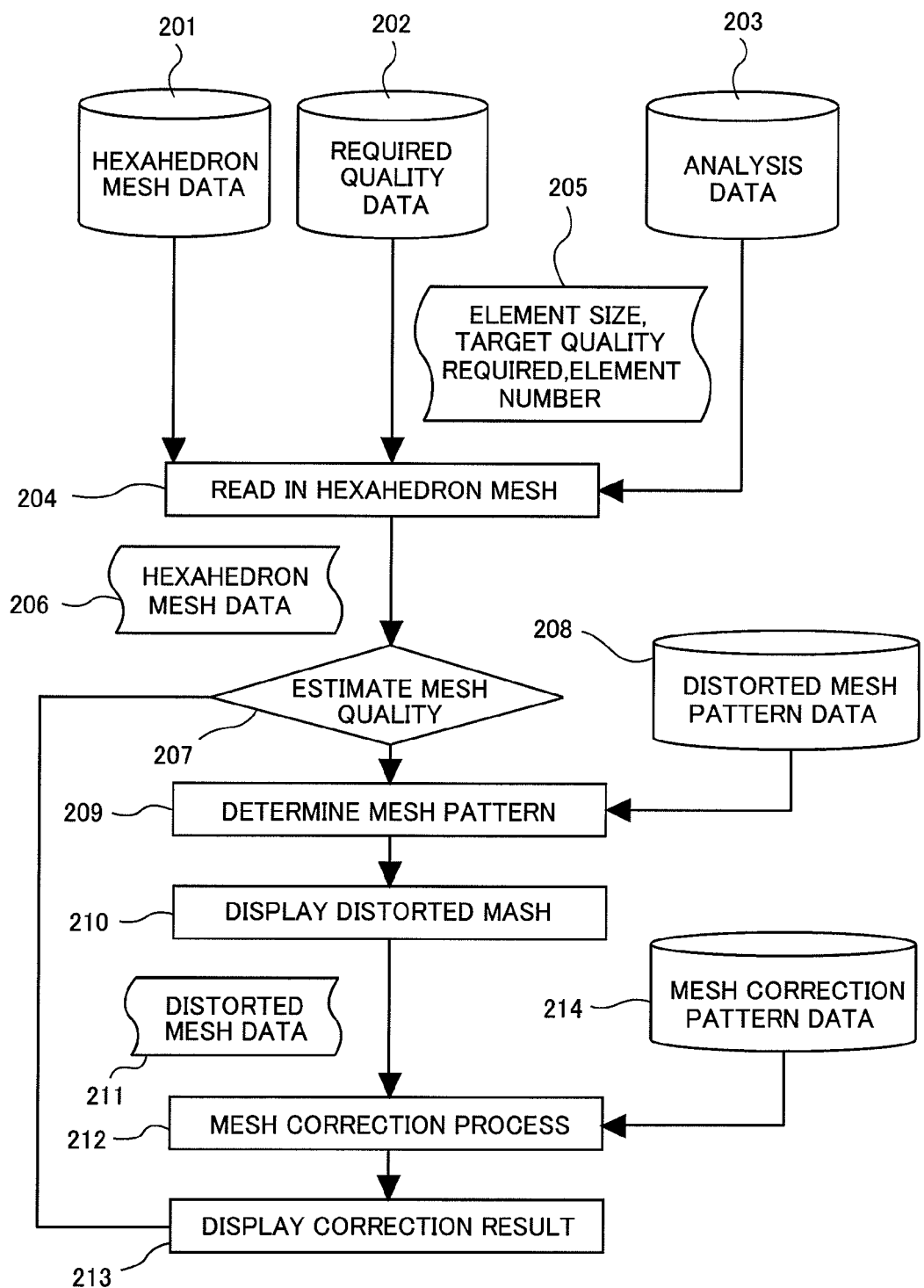
FIG. 2 is a view for showing a flow of data in the analysis model generation system mentioned above.

FIG. 2 is a view for showing a flow of data in the analysis model generation system mentioned above. First of all, the hexahedral mesh data 201, the required quality data 202 and the analysis data 203 are read from each of the storage portions (process 204). Herein, a reference numeral 205 depicts an element size, a target required quality and an element number, etc., building up the required quality data.

Upon the hexahedral mesh data 206 read in is conducted a mesh quality estimation 207, and if there is distortion within the hexahedral mesh data, then classification/determination 209 is conducted on the distorted mesh pattern. In the classification/determination of the distorted mesh pattern, it is classified/determined to which distorted mesh pattern the hexahedral mesh data having the distortion therein corresponds, from the distorted mesh pattern data 208, which are registered within the distorted mesh pattern database 101. A result of classifying/determining is displayed 210, as the distorted mesh data 211 within the hexahedral mesh data. If there is no distortion in the hexahedral mesh data, the display process is conducted only a result thereof, but without conducting the mesh correction.

Upon the distorted mesh data 211 is conducted the mesh correction process 212, and a display process 213 is conducted on a result of having done the correction thereon. Thus, within the mesh correction process 212, with applying the correction method(s) corresponding to the distorted mesh pattern, from the mesh correction pattern registered in the mesh correction pattern database 115, there is conducted the displaying process 213 for displaying the results before and after the correction.

Figure 3:
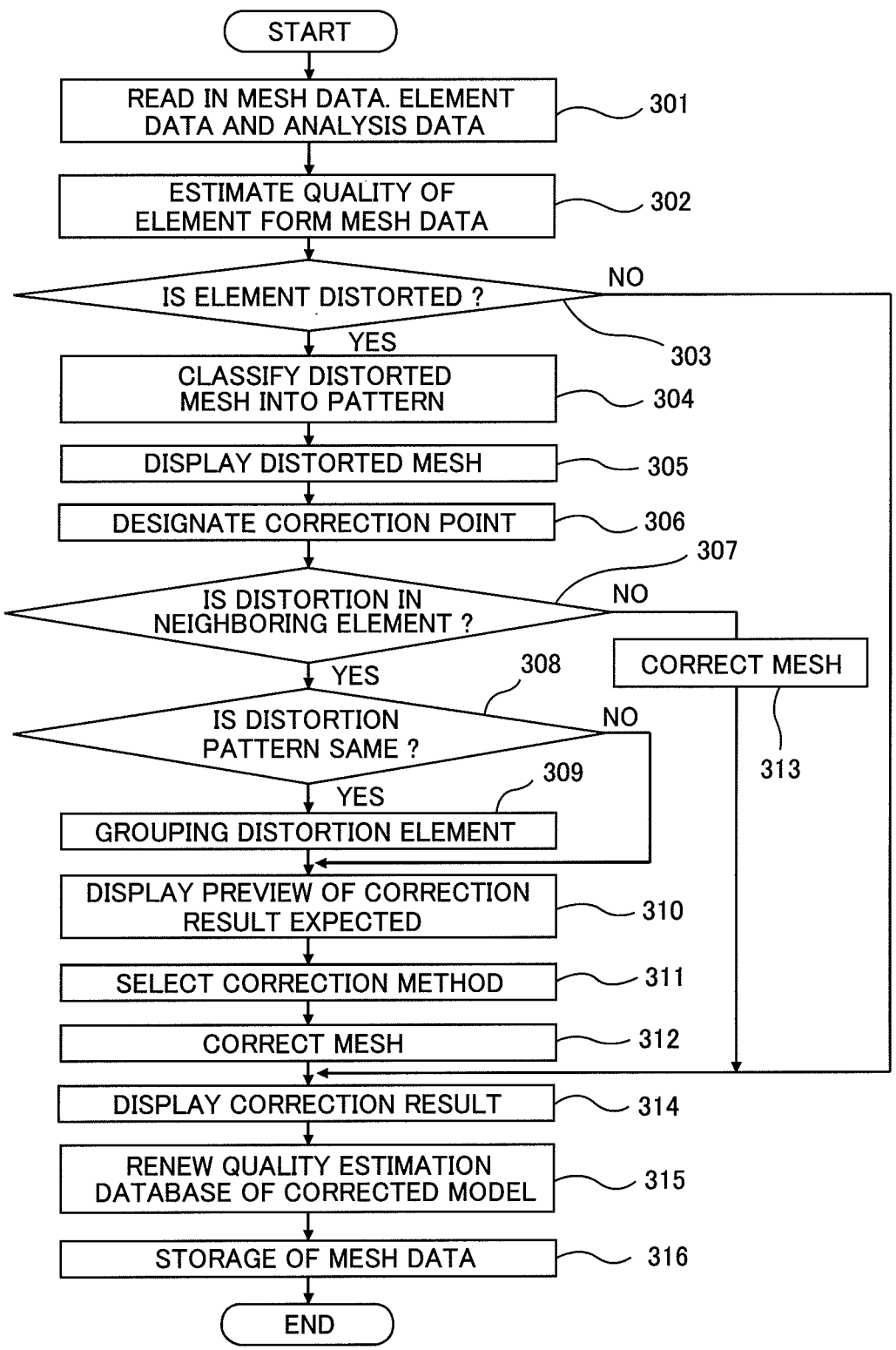
FIG. 3 is a flowchart for showing the details of a correction process in the analysis model generation system mentioned above.

FIG. 3 attached herewith is a flowchart for showing the details of the correction process. First of all, the hexahedral mesh data, the element data and the analysis data are read in (301). Following thereto, the quality estimation is done on the element, upon basis of the hexahedral mesh data (302). As a result of the quality estimation, if there is the distorted element therein (303), the pattern classification is done on the distorted mesh (304). As a result of the pattern classification, the distorted mesh is displayed (305). For the distorted mesh, designation of the point or spot of the correction target (306) is made, and then the search is conducted on the correction target point. For the correction target point, search is conducted on the neighboring element. In case where the neighboring element is the distorted element (307), it is checked on whether the neighboring distorted pattern is the same one or not, and if it is the same pattern (308), the grouping is conducted for the distorted element (309). The results before and after the correction, in case when conducting the correction on the elements grouped, collectively, are displayed to the user (310), as a result of expectation. On the preview display, a plural number of the correction methods are proposed, for the distorted element, in a manner of a list thereof, in a dialog manner. After the user selects the correction method(s) on this list (311), in the dialog manner, then the correction is made on the distorted mesh (312). In case where there is no distortion in the neighboring element(s), then the correction is made only upon the mesh having that distortion (313). Next, a result of the correction is displayed (314), and renewal is made of the equality estimation of the mesh model and of each database (315), accompanying with the correction. Finally, the mesh data is stored as the analysis model (316).

In this manner, the distortion shape or configuration is classified into patterns, so as to execute the correction method corresponding to that pattern, and thereby enabling to generate the mesh data for use of analysis with high quality.

Further, in case where there is the distortion in the element neighboring with the element as the target, and if the distortion pattern is same to that, then correction is made on them, collectively, and then it is possible to correct the distortions, quickly.

Figure 4A:
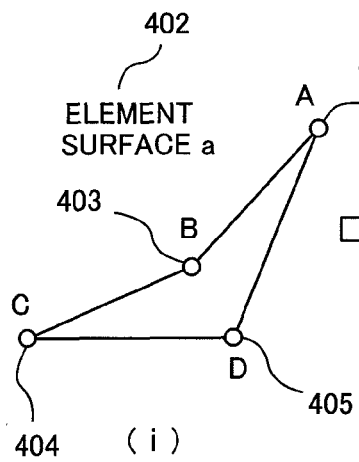
FIGS. 4A to 4C are views for shown an example of the mesh correcting process mentioned above.
Figure 4B:
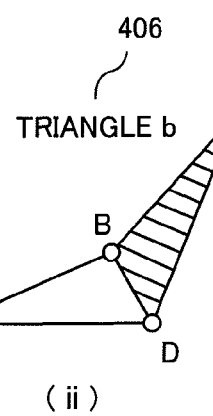
Figure 4C:
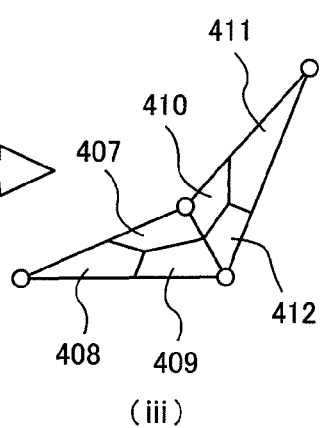

FIGS. 4A to 4C are views for showing an example of the correction process, in particular, for correcting a large element, being large of the element interior angle of the mesh, among the mesh correction methods mentioned above. This is aimed to reduce the distortion due to the element interior, in particular, for the boomerang-type element as shown in FIG. 4A, by dividing the element at a node being large in the element interior angle thereof. For the boomerang-type element, the correction is made with dividing the element with the following algorithms:

1. Searching the element exceeding the threshold value of the element interior angel;
2. Search a node "B" (403) being the largest in the interior angle, among the elements (FIG. 4A);
3. Connecting anode "D" (405) locating at the opposite angle position to the node "B", with the node "B" on the element surface a (402);
4. Sweeping a line "BD" to the element surface opposite to the element surface "a", and dividing the element (FIG. 4B);
5. Dividing the surface, so as to obtain a combination of squares from a triangle, for the triangle surface "b" (406). Producing lines of connecting middle points on sides of the triangle and a gravity center thereof, so as to divide the surface (407 to 412); and
6. Sweeping the dividing lines for dividing the triangle surface to a triangle surface locating at an opposite surface thereof, so as to divide the element (FIG. 4C).

Figure 5:
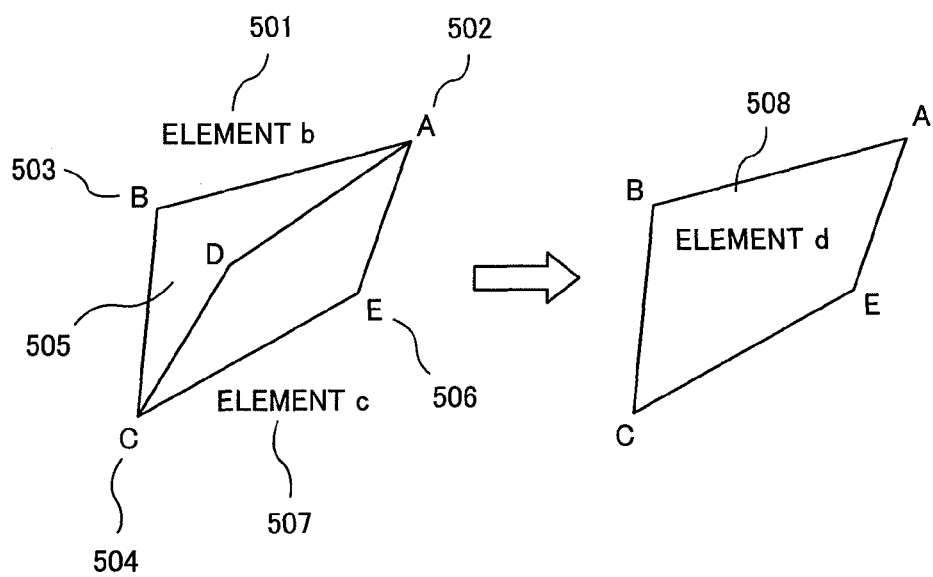
FIG. 5 is a view for shown further other example of the mesh correcting process mentioned above.

FIG. 5 attached herewith is a view for showing an example of a correction method for correcting the distorted element, which is large in the element interior angle of the mesh, among the mesh correction methods mentioned above. Estimation of quality is made on the element "b" (501), comparing to that of the neighboring element, and correction is made with joining or connecting the elements. In case where the element "b" is the boomerang element, correction is made with deleting the surface(s) and/or line(s), which is/are held in common, by referring to the element "c" (507) neighboring to the boomerang element. In more details, the correction is made on the distorted element by the following algorithm:

1. Searching the distorted element;
2. Tracing the neighboring element of the element "b" (501), i.e., the distorted element;
3. Deleting a common side "AD" (i.e., a side connecting between the nodes 502 and 505, herein after being described "502, 505"), a common side "DC" (504, 505), for the neighboring element "c" (507); and
4. Estimating the quality for an element "d" (508), which is produced by the joining or connecting. If the result of estimation is better than that before the joining, then the joining is conducted. This is also executed on the element neighboring therewith, in order to maintain the conformity or matching thereof.

Figure 6A:
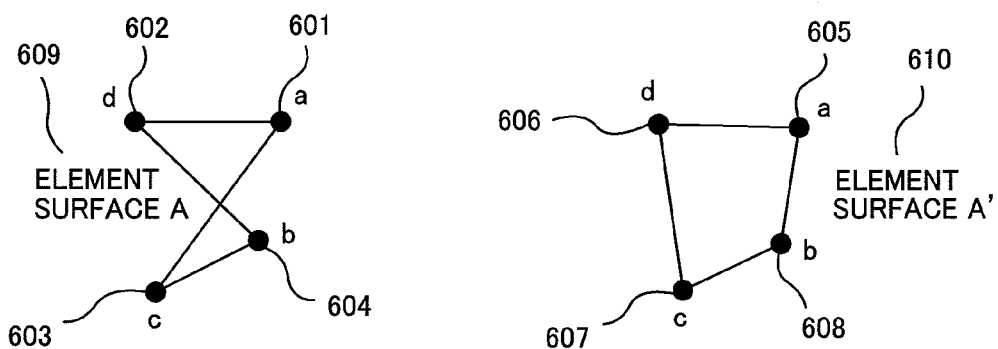
FIGS. 6A to 6C are views for shown other example of the mesh correcting process mentioned above.
Figure 6B:
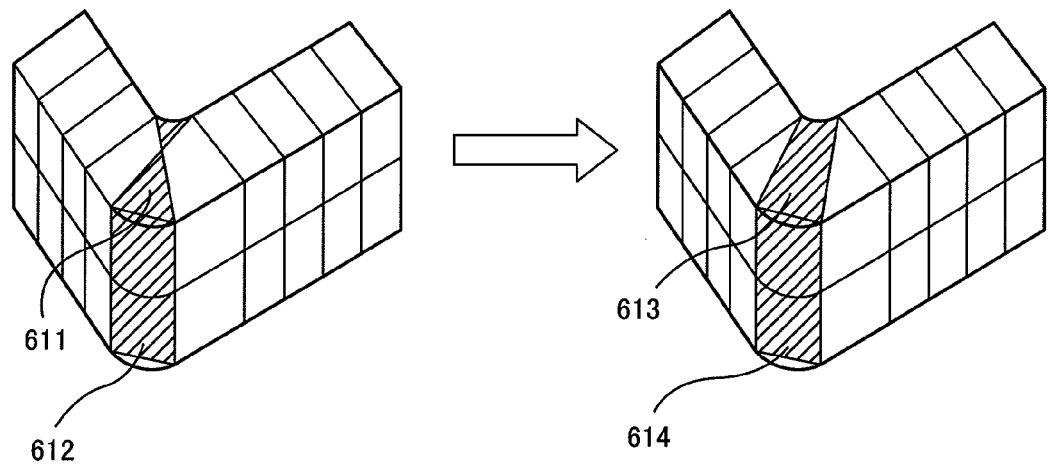
Figure 6C:
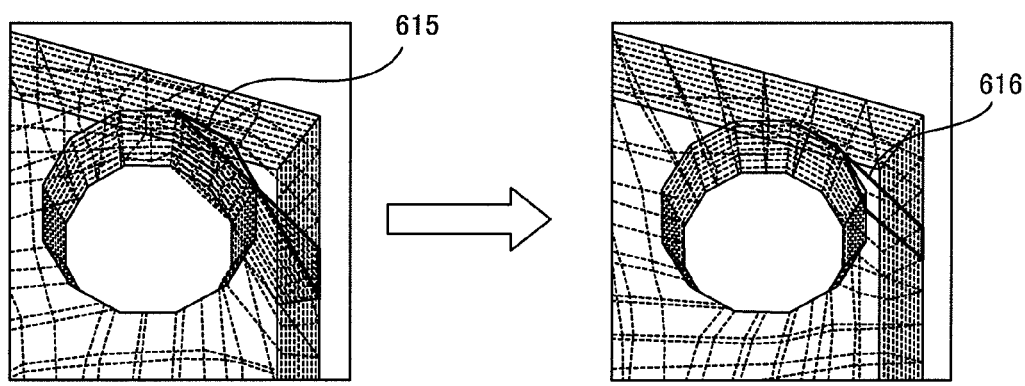

FIGS. 6A to 6C are views for showing an example of the correction method for correcting an element, which is small in the distortion and the element volume thereof, among the mesh correction methods mentioned above. The element, the sides of which are crossing with each other, can be detected by obtaining the distortion and the volume thereof.

FIG. 6A is a view for showing the correction method, for the element of the "λ"-shape type elements, which is reversed of the element surface thereof. In case where the element surface is reversed, the correction is made with replacing the element side(s). With the element surface "A" (609), in particular when the element surface "A" is reversed, searching is made on the portion where the element sides are crossing with each other. In this case, since the element side "ac" (601, 603) and the element side "bd" (602, 604) are crossing, attention is paid on a node "d" (602), and then the replacement is made either one of the element sides joining or connecting to the node "a" (601) or the node "b" (604), in advance. For the node "d", the element side joining or connecting with the node "b" is replaced by the node "c" (603), for the node "a", the element side joining or connecting with the node "c" is replaced by the node "b" (604); thereby producing an element surface "A'" (610). Following to the above, checking is made on whether the element sides of the element surface "A'" are crossing with each other or not. In case where the element sides are not crossing, the element surface "A'" and also the neighboring element thereof are corrected, so as to maintain the conformity or matching of the mesh.

FIG. 6B is a view for showing the correction method of the "λ"-shape type elements, in particular, in "L"-like configuration or shape. In the "L"-type shape, if there is the "λ"-shape type element, such as, the element 611, such replacing process of the element sides as was mentioned above is conducted thereon, and thereby producing an element 613. Also, for the element 612 neighboring with the element 611, the replacing process of the element sides is conducted, and thereby enabling to produce an element 614.

FIG. 6C is a view, further for showing the correction method for conducting the mesh correction, with the replacing process of the element sides, in particular, when there is the "λ" element on a configuration boundary surface. This is a case where an element 615 is in the "λ"-type element, for producing the element joining over the boundary line of a hole and the boundary line of the configuration when the hole is included within the configuration data. With changing a number of dividing the element, as well as, there placing process of the element sides, it is possible to produce an element 616.

In this manner, by patterning the distortions of the mesh, which are contained in the hexahedral configuration mesh data, and by registering the correction methods for distortion corresponding to them in the database, it is possible to conduct correction, finely or minutely, depending on the distorted configuration of the mesh.

The correction method for the mesh data mentioned above will be explained, in more details thereof, by referring to an operation screen of the analysis model generation system.

Figure 7:
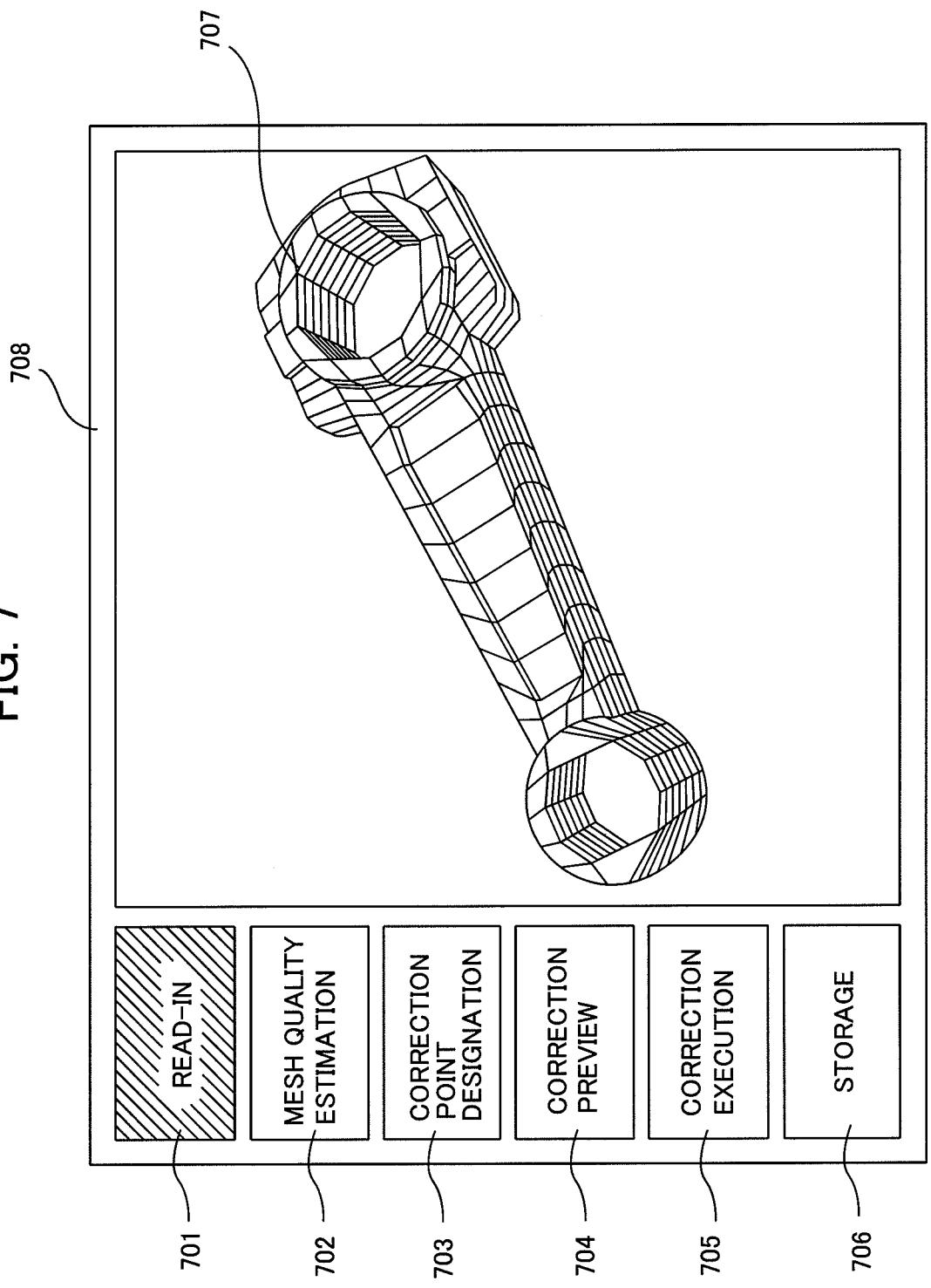
FIG. 7 is a view for showing an example of an operation screen of the analysis model generation system mentioned above.

FIG. 7 attached herewith is a view for showing an example of the operation screen of the analysis model generation system mentioned above. For the operation screen 708, there are disposed the followings on the left-hand side on the screen: i.e., a read-in button 701, a mesh quality estimation button 702, a correction point designate button 703, a correction preview button 704, a correction execution button 705, and a storage button 706. First of all, when the read-in button 701 is pushed down, then the hexahedral mesh data is read into, and is displayed on the screen.

Figure 8:
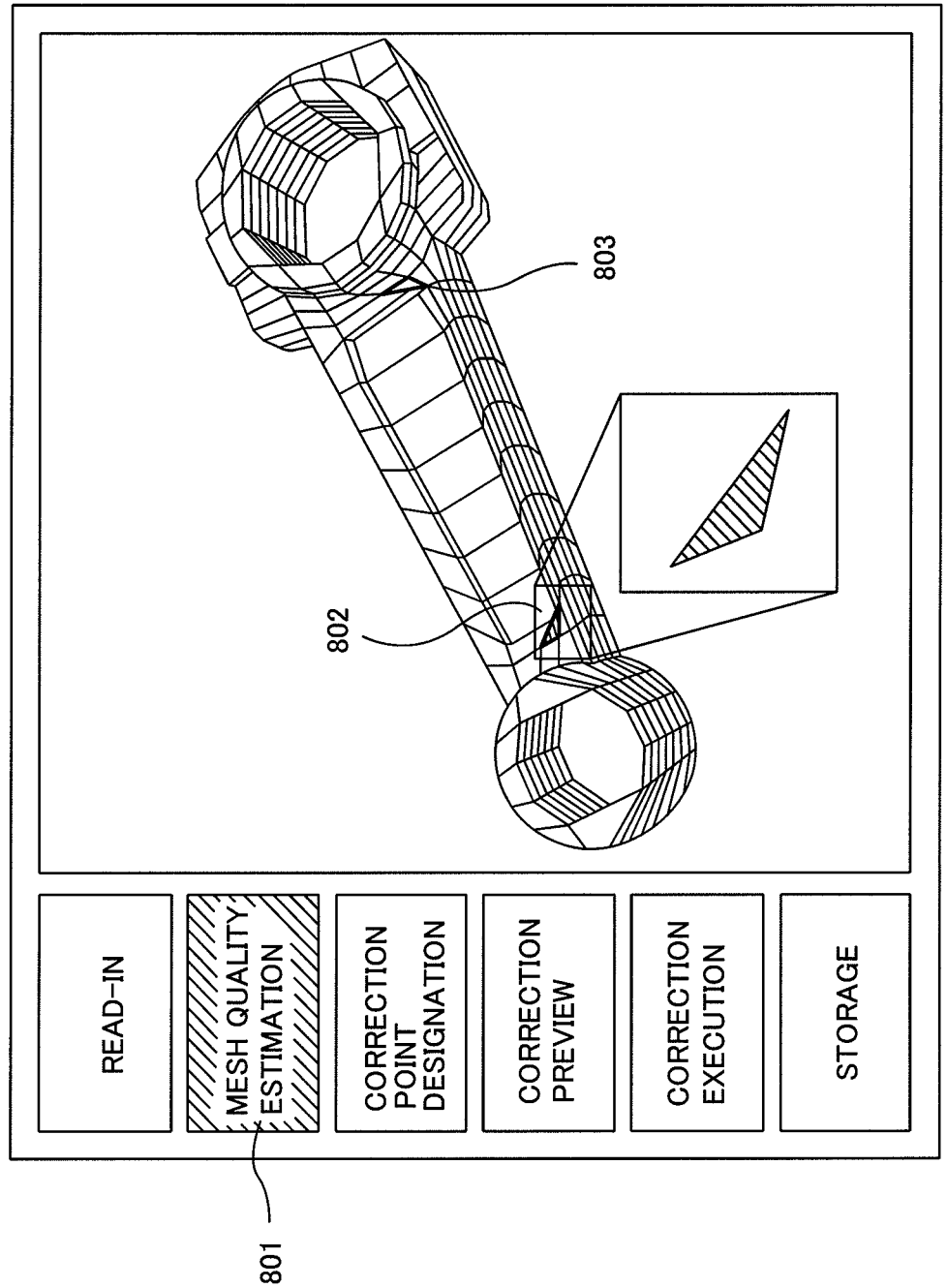
FIG. 8 is a view for shown other example of the operation screen of the analysis model generation system mentioned above.

FIG. 8 attached herewith is a view of other example of the operation screen mentioned above. When the mesh quality estimation button 801 is pushed down for the hexahedral mesh data read therein, then the operation screen is displayed, and are conducted the quality estimation for the hexahedral mesh and the determination of pattern. Indices or indexes of the quality estimation are the element volume, the distortion, the element interior angle, and the stretch. The element, which does not satisfy the required quality, for those indexes, (i.e., the element being equal or less than the threshold value), in other words, the distorted mesh is displayed, with emphasis, to the user. Since there is the boomerang element (802, 803) in the model shown in FIG. 8, the result is displayed, with emphasis.

Figure 9:
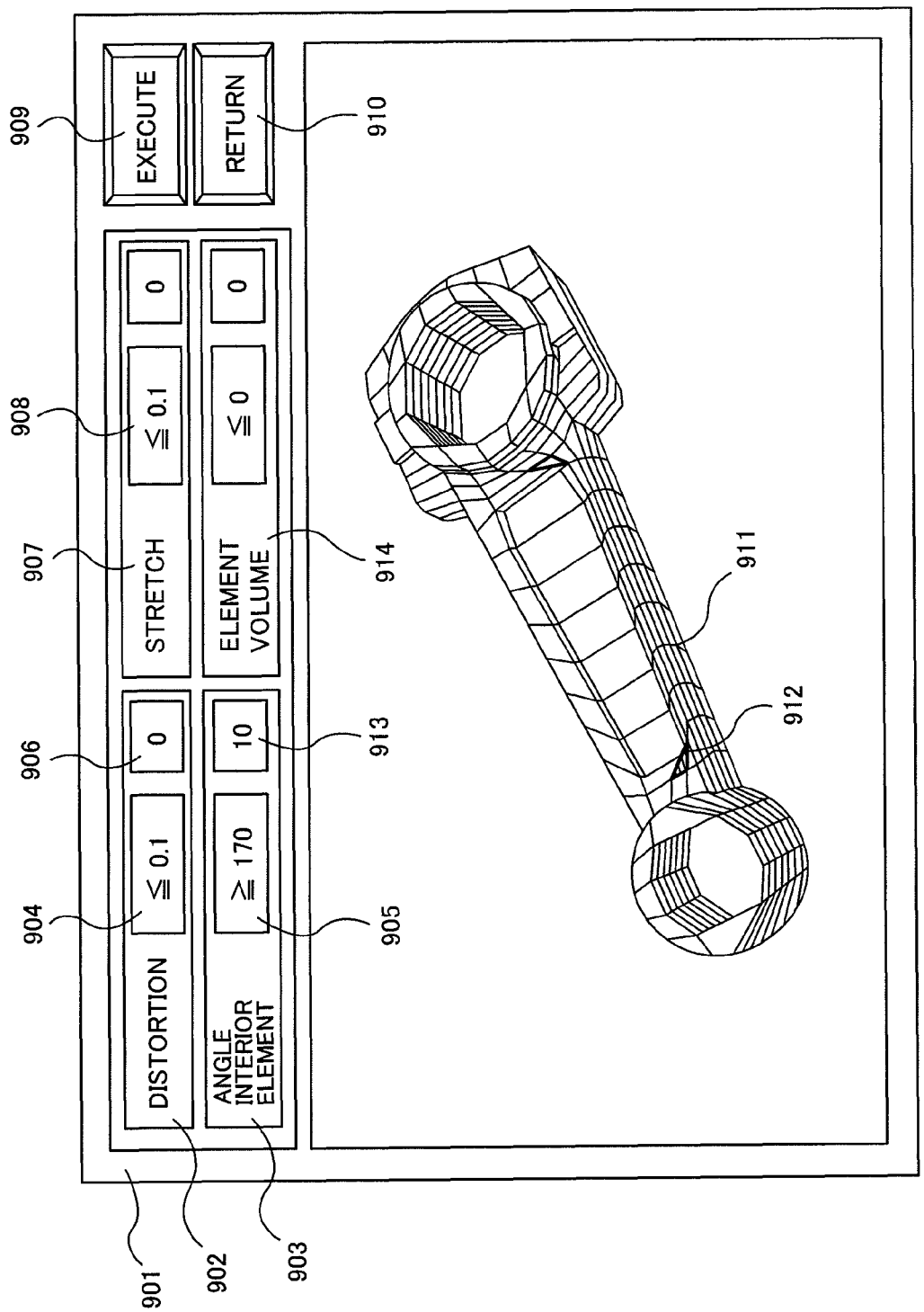
FIG. 9 is a view for shown further other example of the operation screen of the analysis model generation system mentioned above.

FIG. 9 attached herewith is a view of further other example of the operation screen mentioned above. There are shown the indexes, i.e., items for estimating the element quality, on the screen 901. On the screen are shown the indexes for estimating the element quality, i.e., the distortion 902, the element interior angle 903, the stretch 907 and the element volume 914, wherein it is possible to set the threshold value for each of the indexes. For example, in case of the distortion, it is possible to estimate on how many number the elements are, being equal or less than 0.1, through setting by pushing a part shown by a reference number 904. As a result of conducting the estimation, the number of elements is displayed in a part shown by the reference numeral 906. Also, with the element interior angle, setting is made on how many number the elements are, being equal or greater than 170 degree in the threshold value, with pushing down a part shown by a reference numeral 905, and the number of the elements is displayed in a part shown by 913. With the stretch 907, it is possible to set on how many number the elements are, being equal or less than 0.1 in the threshold value, with pushing down a part shown by a reference numeral 908. With the element volume 914, it is possible to estimate on how many number the elements are, being equal or less than 0 in the threshold value.

In this manner, by pushing down an execute button 909, after setting the threshold value of the index for estimating the element, the estimation is executed, and then if there is a element distorted, being equal or less than the threshold value, the emphasizing display is made on the distorted element, as is shown by a reference numeral 912, for the mesh data 911. When pushing down a return button 910, then it turns back to the original screen.

Figure 10:
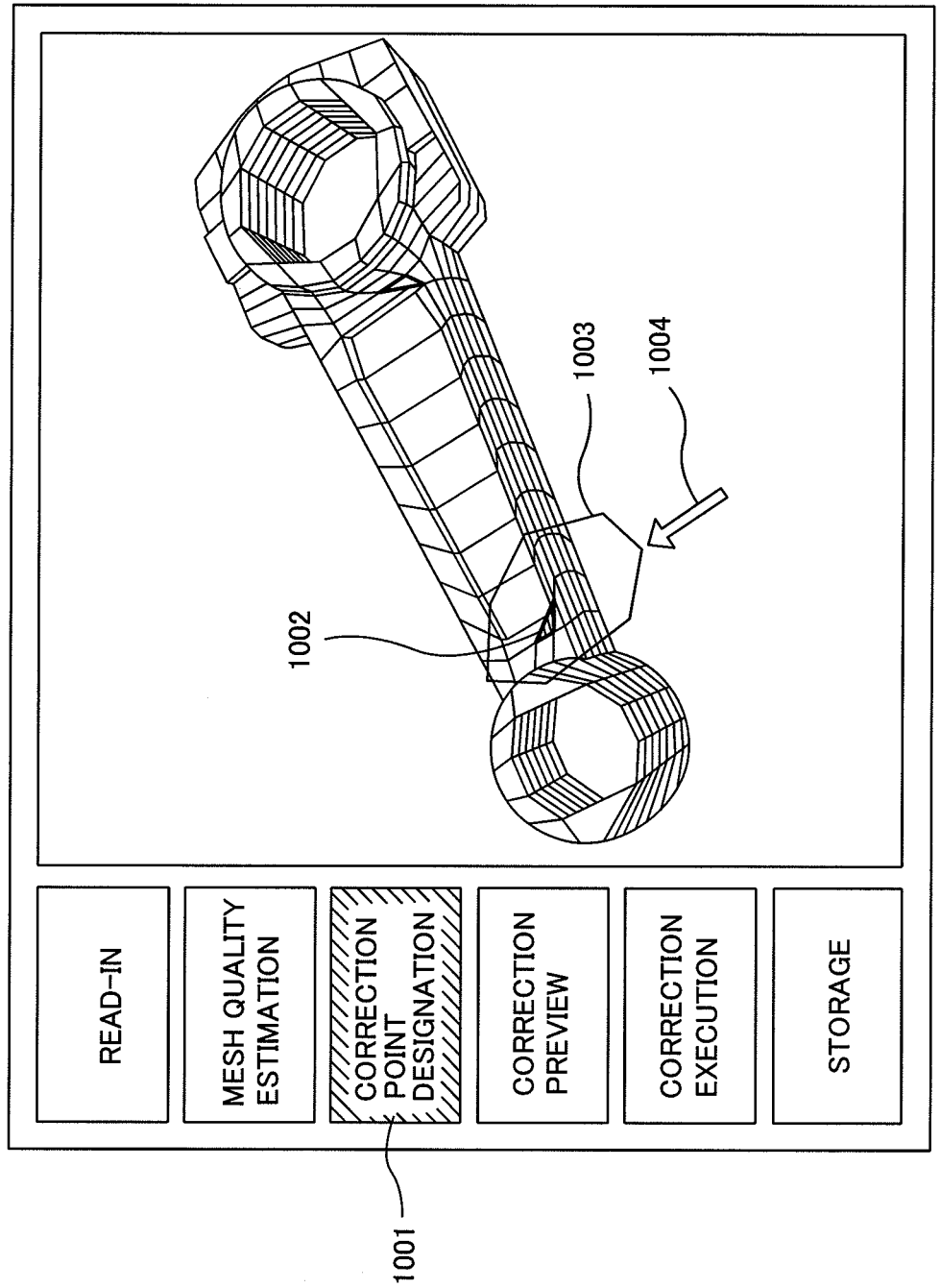
FIG. 10 is a view for shown further other example of the operation screen of the analysis model generation system mentioned above.

FIG. 10 attached herewith is a view for showing further other example of the operation screen mentioned above. On the operation screen shown in FIG. 10 is displayed the distorted mesh, as a result of the mesh quality estimation. Onto this display, the user can select and designate on which mesh the correction should be done. When pushing down the correction point designation button 1001, it is possible for the user to select the distorted mesh, on which she/he wishes to conduct the correction, in the dialog manner. For example, an area 1003 is designated with using a mouse 1004, on which she/he wishes to conduct the correction, and then a target mesh is designated within the area 1003.

Figure 11:
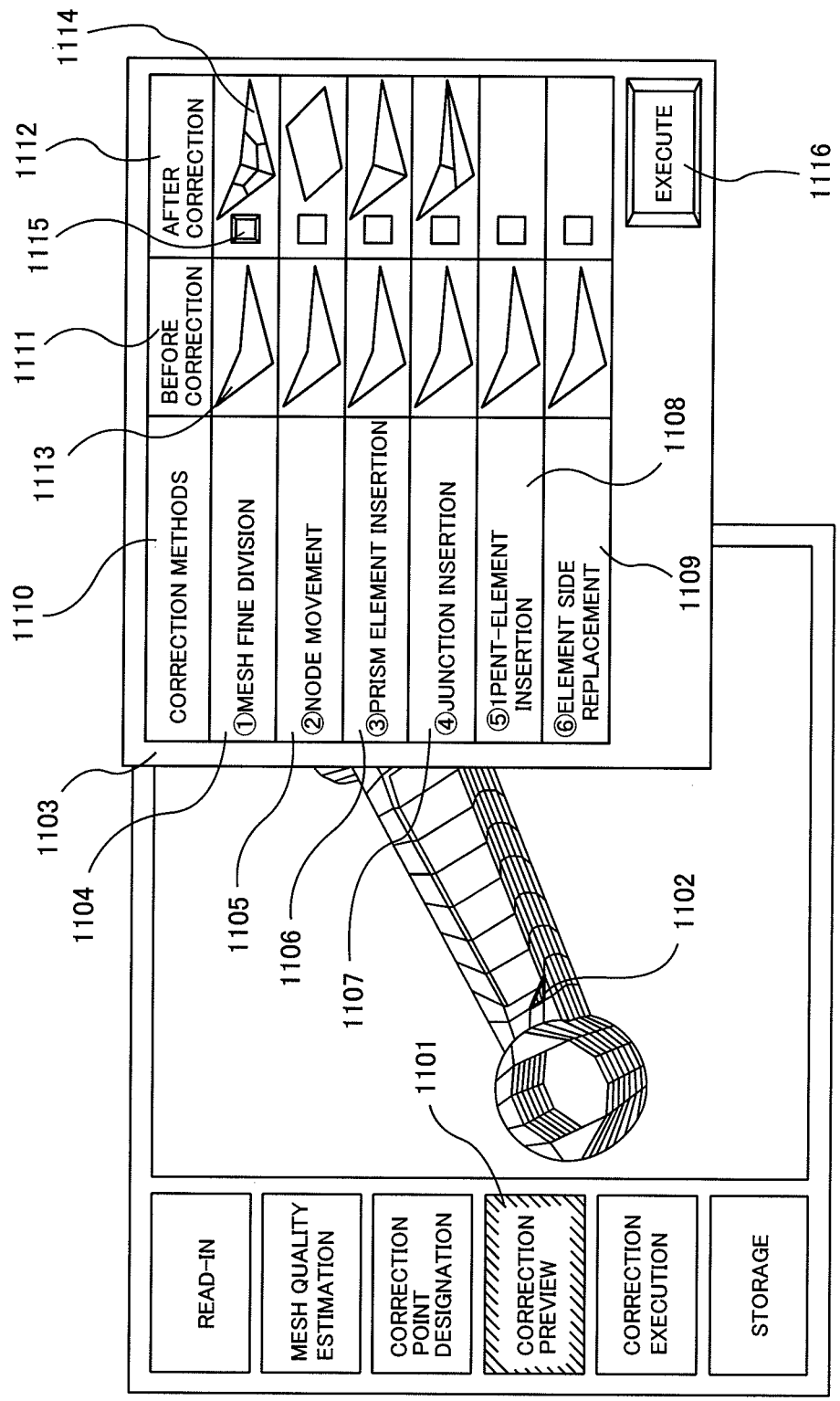
FIG. 11 is a view for shown further other example of the operation screen of the analysis model generation system mentioned above.

FIG. 11 attached herewith is also a view for showing further other example of the operation screen mentioned above. On the operation screen shown in FIG. 11, after designating the target mesh in FIG. 10, there is shown the correction methods, to be candidates corresponding to the distortion pattern of the distorted mesh. When pushing down the correction preview button 1101, the results of the mesh before and after the correction are displayed in a form of a table 1103, for the target mesh 1102. On the preview screen of the corrected element after pushing down this correction preview button 1101, there are displayed the correction methods, listing up a correction method 1110, an element before correction 1111 and an element after correction 1112, as the items thereof. On this FIG. 11 are proposed the followings: i.e., mesh fine division 1104, node movement 1105, prism element insertion 1106, junction element insertion 1107, penta-element insertion 1108 and element side replacement 1109. For example, in the mesh fine division 1104, the mesh 1114 is displayed for showing that after the correction, for the element 1113 before the correction.

When pushing down the execute button 1116, after checking 1115, with which correction method the distortion should be corrected, by the user, then the correction of mesh is executed. If there is the distorted element neighboring therewith, the distortions are corrected, collectively. Also, for maintaining the conformity or matching between them, the correction is also executed on the element neighboring therewith.

In the example shown in FIG. 11, since the mesh comes to be fine when selecting the mesh fine division 1104, there is a necessity of conducting the fine division upon the neighboring element for maintaining the conformity or matching therebetween.

Figure 12:
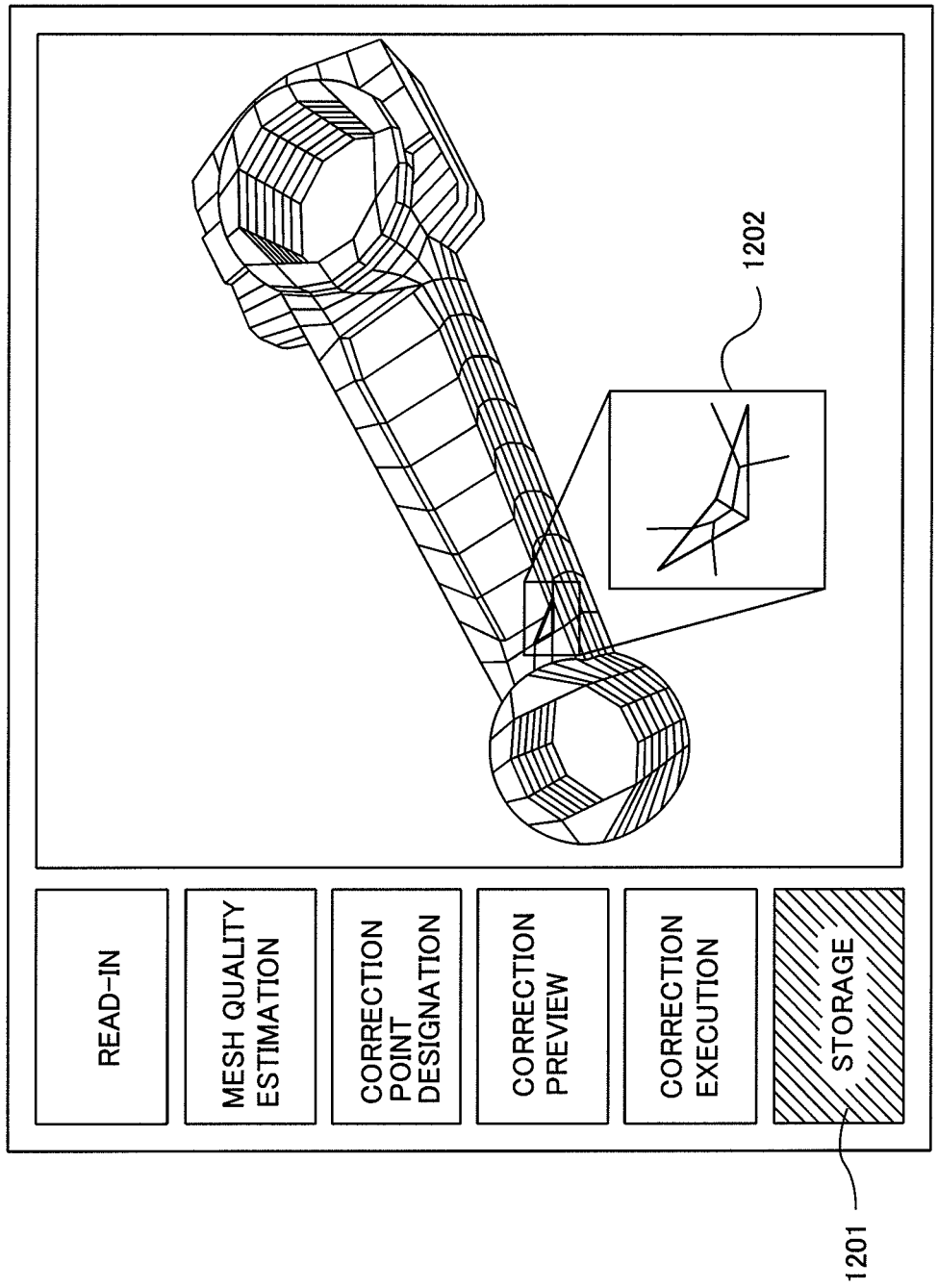
FIG. 12 is a view for shown further other example of the operation screen of the analysis model generation system mentioned above.

FIG. 12 attached herewith is also a view for showing further other example of the operation screen mentioned above. FIG. 12 shows a screen for displaying a result after the correction, i.e., after executing the correction process by means of the mesh fine division on the screen shown in FIG. 11. This is treated, with conducting the fine division upon the distorted mesh 1202, and also conducting the fine division upon the neighboring element. When pushing down the storage button 1201, the mesh model corrected is stored.

In this manner, by allowing the user to select the correction point and/or the correction method, in the diagonal manner, on the operation screen, it is possible to produce or generate a model of the mesh data for use of analysis, easily, with high efficiency.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications that fall within the ambit of the appended claims.

What is claimed is:

1. An analysis model generation system, for generating an analysis model of an analysis target, by correcting a distortion configuration owned by a mesh set data, which is generated by transforming said analysis target into a set of meshes being made up with hexahedrons, comprising:
    a computer including: a mesh data read-in portion, which is configured to read said mesh set data therein;
    a mesh quality estimate portion, which is configured to estimate quality of a mesh of said mesh set data;
    a first database, which is configured to store plural distorted mesh patterns useable for classifying each candidate distortion configuration of said mesh of said mesh set data into one of the plural distorted mesh patterns;
    a mesh pattern determination portion, which is configured to determine, to which distorted mesh pattern of the distorted mesh patterns that a subject distortion corresponds to, when said mesh has said subject distortion as a result of the quality estimation within said mesh quality estimation portion;
    a second database, which is configured to store correction methods for correcting distortion configurations corresponding to the distorted mesh patterns stored in said first database;
    a mesh correction portion, which is configured to correct said subject distortion by using a correction method of the correction methods stored in the second database, where the correction method is selected upon a basis of the distorted mesh pattern determined by said mesh pattern determination portion; and
    a mesh data display portion, which is configured to display a result of conducting the correction.

2. The analysis model generation system, as described in the claim 1, wherein
    estimation is made on whether a mesh neighboring with the mesh as a correction target has the distortion or not, and if said neighboring mesh has the distortion, then said neighboring mesh is corrected together with said mesh as the correction target.

3. The analysis model generation system, as described in the claim 1, wherein
    said correction method is proposed, corresponding to the mesh as the target of correction, in an interactive manner.

4. The analysis model generation system, as described in the claim 1, wherein
    said distortion mesh patterns include:
    a mesh having a boomerang element, in which one (1) node of an element building up said mesh is not located at a proper position thereof, and thereby forming a boomerang-type configuration;
    a mesh having a first negative element, in which one (1) node enters into an inside of said element, and therefore sides of the element intersect with each other, in a view direction thereof;
    a mesh having a second negative element, in which a node is disposed on an element surface, therefore not intersecting, but is crushed on said element surface;
    a mesh having a third negative element, in which a node of said element is shifted outside said element; and
    a mesh having a distortion element, in which the element is extended, so that the element surface does not become a square but shows a warped shape.

5. The analysis model generation system, as described in the claim 4, wherein the warped shape is a parallelogram or a rhomboid.

6. A hexahedron-mesh analysis model generation system, for generating a hexahedron-mesh analysis model of an analysis target, by correcting a distortion configuration owned by a hexahedron-mesh set data, which is generated by transforming said analysis target into a set of hexahedron meshes being made up with hexahedrons, comprising:
    a computer including: a hexahedron-mesh data read-in portion, which is configured to read said hexahedron-mesh set data therein;
    a hexahedron-mesh quality estimate portion, which is configured to estimate quality of a hexahedron-mesh of said hexahedron-mesh set data;
    a first database, which is configured to store plural distorted hexahedron-mesh patterns useable for classifying each candidate distortion configuration of said hexahedron-mesh of said hexahedron-mesh set data into one of the plural distorted hexahedron-mesh patterns;
    a hexahedron-mesh pattern determination portion, which is configured to determine, to which distorted hexahedron-mesh pattern of the distorted hexahedron-mesh patterns that a subject distortion corresponds to, when said hexahedron-mesh has said subject distortion as a result of the quality estimation within said hexahedron-mesh quality estimation portion;
    a second database, which is configured to store correction methods for correcting distortion configurations corresponding to the distorted hexahedron-mesh patterns stored in said first database;
    a hexahedron-mesh correction portion, which is configured to correct said subject distortion by using a correction method of the correction methods stored in the second database, where the correction method is selected upon a basis of the distorted hexahedron-mesh pattern determined by said hexahedron-mesh pattern determination portion; and
    a hexahedron-mesh data display portion, which is configured to display a result of conducting the correction.

7. The analysis model generation system, as described in the claim 6, wherein
    estimation is made on whether a neighboring hexahedron-mesh neighboring with the hexahedron-mesh as a correction target has the distortion or not, and if said neighboring hexahedron-mesh has the distortion, then said neighboring hexahedron-mesh is corrected together with said hexahedron-mesh as the correction target.

8. The analysis model generation system, as described in the claim 6, wherein
    said correction method is proposed, corresponding to the hexahedron-mesh as the target of correction, in an interactive manner.

9. The analysis model generation system, as described in the claim 6, wherein
    said distortion hexahedron-mesh patterns include:
    a hexahedron-mesh having a boomerang element, in which one (1) node of an element building up said hexahedron-mesh is not located at a proper position thereof, and thereby forming a boomerang-type configuration;
    a hexahedron-mesh having a first negative element, in which one (1) node enters into an inside of said element, and therefore sides of the element intersect with each other, in a view direction thereof;

a hexahedron-mesh having a second negative element, in which a node is disposed on an element surface, therefore not intersecting, but is crushed on said element surface;

a hexahedron-mesh having a third negative element, in which a node of said element is shifted outside said element; and a hexahedron-mesh having a distortion element, in which the element is extended, so that the element surface does not become a square but shows a warped shape.

10. The analysis model generation system, as described in the claim 9, wherein the warped shape is a parallelogram or a rhomboid.

* * * * *